United States Patent [19]

Nam et al.

[11] Patent Number: 5,728,627
[45] Date of Patent: Mar. 17, 1998

[54] METHODS OF FORMING PLANARIZED CONDUCTIVE INTERCONNECTS FOR INTEGRATED CIRCUITS

[75] Inventors: In-ho Nam, Kyungki-do; Won-seong Lee, Seoul, both of Rep. of Korea

[73] Assignee: Samsung Electronics Co., Ltd., Suwon, Rep. of Korea

[21] Appl. No.: 747,783

[22] Filed: Nov. 14, 1996

[51] Int. Cl.$^6$ ............................................. H01L 21/4763
[52] U.S. Cl. ........................... 438/618; 438/626; 438/631
[58] Field of Search ................................. 437/47, 48, 52, 437/60, 195; 438/618, 626, 631, 633, 657

[56] References Cited

U.S. PATENT DOCUMENTS

| 4,645,562 | 2/1987 | Liao et al. | 156/643 |
| 5,346,844 | 9/1994 | Cho et al. | 437/52 |
| 5,387,533 | 2/1995 | Kim | 437/52 |

*Primary Examiner*—John Niebling
*Assistant Examiner*—Joni Y. Chang
*Attorney, Agent, or Firm*—Myers Bigel Sibley & Sajovec

[57] ABSTRACT

A conductive planarization layer, preferably a doped polysilicon layer, is used as a planarization layer for forming a conductive interconnect, such as a memory device bit line, thereon. Etching of the doped polysilicon planarization layer may be accurately controlled to form a planarized layer of controlled thickness, without requiring high temperature reflow heating of boro-phospo-silicate glass which can degrade transistor parameters. In particular, an insulating layer is formed on spaced apart source and drain regions and on the gate therebetween. A doped polysilicon layer is formed on the insulating layer. The doped polysilicon layer is planarized. A contact hole is formed in the insulating layer and in the doped polysilicon layer, to thereby expose the source or drain region. A conductive interconnect is then formed in the contact hole and on the gate.

20 Claims, 5 Drawing Sheets

METHODS OF FORMING PLANARIZED CONDUCTIVE INTERCONNECTS FOR INTEGRATED CIRCUITS

FIELD OF THE INVENTION

This invention relates to integrated circuit fabrication methods, and more particularly to fabrication of conductive interconnects for integrated circuits.

BACKGROUND OF THE INVENTION

Conductive interconnects are generally used in integrated circuits to selectively interconnect active devices such as transistors. For example, conductive bit lines are generally used to connect the drain regions of field effect transistors in an integrated circuit memory device. In such devices, it is generally preferred for the conductive interconnects such as a bit line, to have a low resistance to allow high speed operation. Accordingly, bit lines of memory devices are generally formed using a silicide structure.

Unfortunately, the topography of the integrated circuit is often nonplanar due to the various underlying structures which are formed on the integrated circuit. The nonplanar integrated circuit surface may therefore result in a nonplanar conductive interconnect which includes depressed portions based upon the morphology of the underlying structure. The nonplanar topography may cause various problems.

For example, it is generally desired for the conductive interconnect to be patterned so that it only extends on selected portions of the integrated circuit. However, if the conductive interconnect includes depressed portions, it may be difficult to remove the conductive layer which is formed in these depressed portions. In an integrated circuit memory which includes a bit line of a stacked structure, it may be even more difficult to remove the conductive interconnect from the depressed portion. Moreover, the reflective effect of the surface of the depressed portion may make it difficult to photolithographically define the conductive interconnect.

Accordingly, it is known to planarize the surface of an integrated circuit before forming a conductive interconnect thereon. Planarization is generally performed using a boro-phospo-silicate glass (BPSG) layer on the surface of the integrated circuit. The BPSG layer can planarize the depressed portions because its fluidity increases as heat is applied. As a result of the planarized BPSG layer, a conductive interconnect including a doped polysilicon layer and a silicide layer can be formed and patterned.

Unfortunately, the heating process which reflows the BPSG may degrade the punch-through or other characteristics of the transistor. These effects may be exacerbated as the integration density of transistors increases and channel lengths shrink.

In order to avoid a heated reflow, it is also known to etch the BPSG layer to attempt to achieve planarity. It is also known to use undoped silicon glass (USG) which can be formed as a relatively thick layer and then etched in an attempt to achieve planarity.

FIGS. 1–3 illustrate a conventional method of fabricating a conductive interconnect, such as a bit line in an integrated circuit. Referring to FIG. 1, a gate electrode 12 is formed on a semiconductor substrate 10. Then, dopants are implanted into the surface of the semiconductor substrate 10 using gate electrode 12 as a mask to form a source region (S) and a drain region (D) in the semiconductor substrate 10. The spaced apart source and drain regions in the semiconductor substrate and the gate on the integrated circuit substrate therebetween form a field effect transistor.

Still referring to FIG. 1, an undoped oxide layer 13 is formed on the surface of the semiconductor substrate 10 using chemical vapor deposition (CVD) or other conventional methods. A planarization layer 16 is formed on the undoped oxide layer 13. For example, BPSG may be used as the planarization layer 14. It should be noted that oxide layer 13 is generally formed between the BPSG and the semiconductor substrate, because a direct contact between the BPSG layer and the semiconductor substrate may degrade the transistor.

Still referring to FIG. 1, BPSG layer 14 is nonplanar and includes a depressed portion 16. However, if the integrated circuit is heated, the fluidity of BPSG layer 14 increases to thereby fill the depressed portion 16. Thus, as shown in FIG. 2, the surface of the BPSG layer is planarized. In other words, the depth of the depressed portion 16 is decreased to a level which allows a conductive interconnect to be formed thereon without the problems noted above.

Referring now to FIG. 3, a contact hole is formed in BPSG layer 14 and in oxide layer 13, and the contact hole is filled to form the conductive interconnect. In order to fill the contact hole, a polysilicon layer 18 is formed on the surface of the BPSG layer 14 and in the contact hole. A tungsten silicide layer 20 is then formed on the polysilicon layer 18. The polysilicon layer 18 and the tungsten silicide layer 20 are then patterned to form the conductive interconnect such as a bit line, as shown in FIG. 3.

As described in connection with FIG. 2, the BPSG planarization layer is planarized by heating, in the conventional method. Unfortunately, if the channel length of the transistor which is formed in the integrated circuit is short, punch-through and other characteristics of the transistor may be degraded. Moreover, in alternate fabrication methods, the BPSG layer may be planarized by etching rather than heating. However, it may be difficult to control the etching uniformity of the BPSG layer.

Moreover, it may be difficult to determine an optimum end point for the etching process, so that the etch process is generally performed for a predetermined constant time for each wafer. In particular, excessive etching may cause a short circuit between the polysilicon layer of the bit line and other layers, resulting in a defective integrated circuit. In contrast, insufficient etch-back may leave a thick planarization layer which may render it difficult to form a contact. Since the etch rate can change slightly as the status of the fabrication equipment changes, the etch rate must generally be continuously monitored and etch times and other parameters must generally be continuously adjusted.

SUMMARY OF THE INVENTION

It is therefore an object of the present invention to provide methods of forming conductive interconnects for integrated circuit field effect transistors.

It is another object of the present invention to provide methods of forming planarized conductive interconnects for integrated circuits.

It is yet another object of the present invention to provide planarized conductive interconnect forming methods which do not require excessive heat.

It is still another object of the present invention to provide planarized conductive interconnect forming methods which allow accurate control of planarization layer thickness.

These and other objects are provided, according to the present invention by using a conductive planarization layer, preferably a doped polysilicon layer, as a planarization layer for forming a conductive interconnect thereon. The etching of the doped polysilicon planarization layer may be accurately controlled to form a planarized layer of controlled thickness without requiring high temperature reflow heating.

In particular, methods of forming conductive interconnects for integrated circuit field effect transistors, form an insulating layer on the spaced apart source and drain regions of the transistor and on the gate therebetween. A conductive layer is formed on the insulating layer, and the conductive layer is planarized. A contact hole is then formed in the insulating layer and in the conductive layer to thereby expose the source or drain region. A conductive interconnect is then formed in the contact hole and on the gate.

The planarizing step may be performed in at least one of two ways. In one embodiment, the conductive layer is etched to remove the conductive layer from the gate top, opposite the substrate, and thereby expose the insulating layer on the gate. In another embodiment, the conductive layer is etched without eliminating the conductive layer on the gate top, opposite the substrate, so that the insulating layer on the gate is not exposed.

If the conductive layer is removed from the gate, the conductive interconnect may be formed by forming a doped polysilicon layer in the contact hole and on the insulating layer on the gate, forming a tungsten silicide layer on the doped polysilicon layer, and patterning the doped polysilicon layer and the tungsten silicide layer. Alternatively, if the conductive layer is etched without eliminating the conductive layer on the gate, the conductive interconnect may be formed by forming a doped polysilicon layer in the contact hole and on the conductive layer on the gate, forming a tungsten silicide layer on the doped polysilicon layer and patterning the doped polysilicon layer and the tungsten silicide layer.

The contact hole is preferably formed by patterning a mask on the conductive layer and then etching the conductive layer and the insulating layer using the patterned mask, to thereby expose the source or drain region. Alternatively, a patterned mask may be formed on the conductive layer and the conductive layer may be etched using the patterned mask. The patterned mask may be removed and the insulating layer is etched using the etched conductive layer, to thereby expose the source or drain region. When a patterned mask is used, the patterned mask may be heated to thereby cause the patterned mask to flow and reduce the exposed areas thereof, to thereby form a reduced size contact hole. Alternatively, a reduced size contact hole may be formed by forming a sidewall spacer in the mask.

By using a conductive layer, and preferably a doped polysilicon layer, as a planarization layer, the etch rate thereof may be controlled. Moreover, it can be relatively easy to terminate etching when the surface of the insulating layer is exposed. High temperature reflows of BPSG, or highly controlled etching of the BPSG, are not required.

DETAILED DESCRIPTION OF PREFERRED EMBODIMENTS

Figure 1:
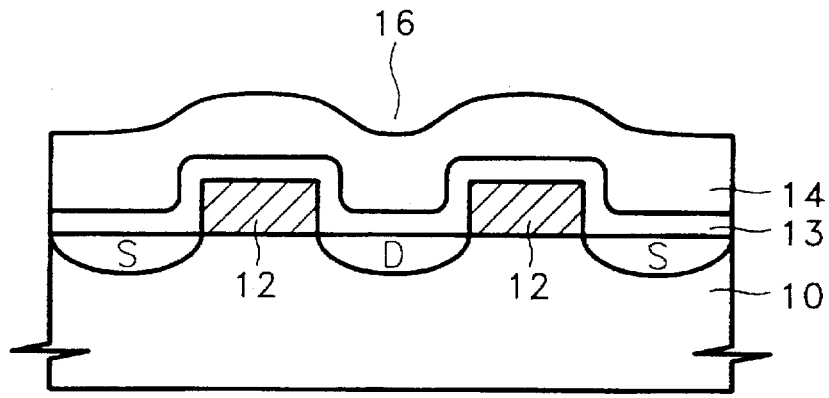
FIGS. 1–3 are cross-sectional views of a fabrication process for a conventional conductive interconnect for an integrated circuit, during intermediate fabrication steps.
Figure 2:
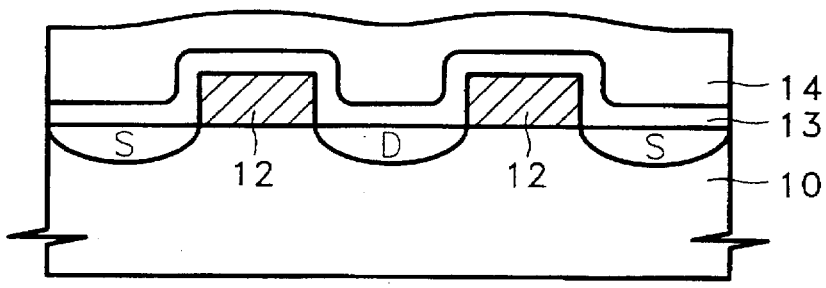
Figure 3:
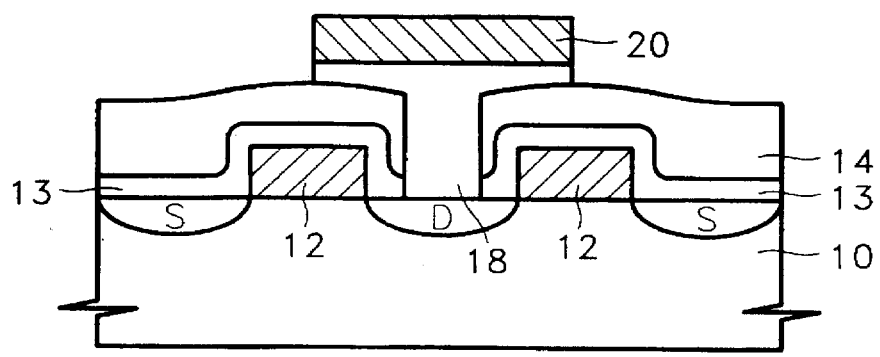

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. Moreover, each embodiment described and illustrated herein includes its complementary conductivity embodiment as well.

Figure 4:
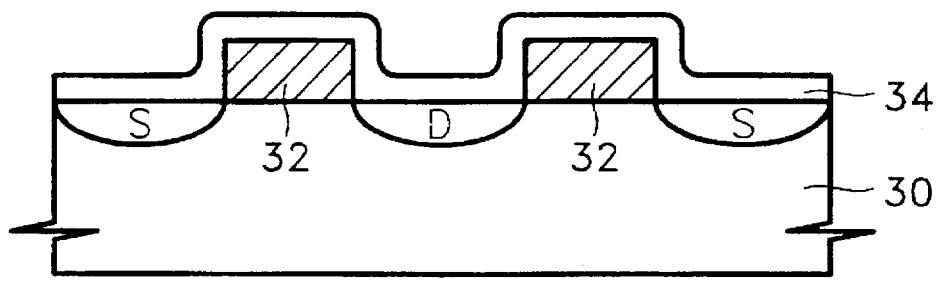
FIGS. 4–9 are cross-sectional views of a fabrication process according to the present invention, during intermediate fabrication steps.

Referring now to FIGS. 4–9, a first embodiment of methods of forming a conductive interconnect for an integrated circuit according to the present invention will now be described. Referring now to FIG. 4, a gate electrode 32 is formed on a semiconductor substrate 30. Then, dopants are implanted into the semiconductor substrate 30 using the gate electrode 32 as a mask. As a result, spaced apart source regions (S) and drain regions (D) are formed in the semiconductor substrate 30 with the gate on the integrated circuit substrate therebetween, to form a field effect transistor. It will also be understood that other conventional transistor fabrication techniques may be used.

Figure 5:
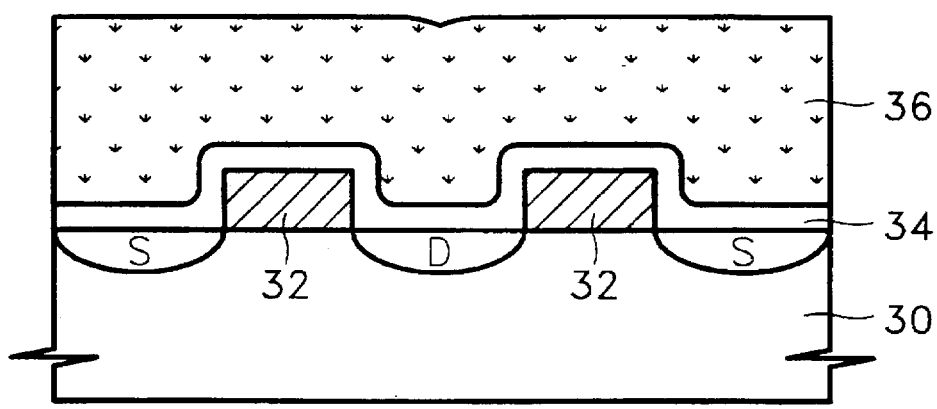

Still referring to FIG. 4, an insulating layer 34 is formed on the spaced apart source and drain regions (S/D) and on the gate electrode 32 therebetween. The insulating layer 34 is preferably a high temperature oxide (HTO) layer. Referring now to FIG. 5, a conductive layer 36 is formed on the insulating layer 34. Here, the conductive layer 36 is doped polysilicon and the conductive layer 36 is relatively thick.

Figure 6:
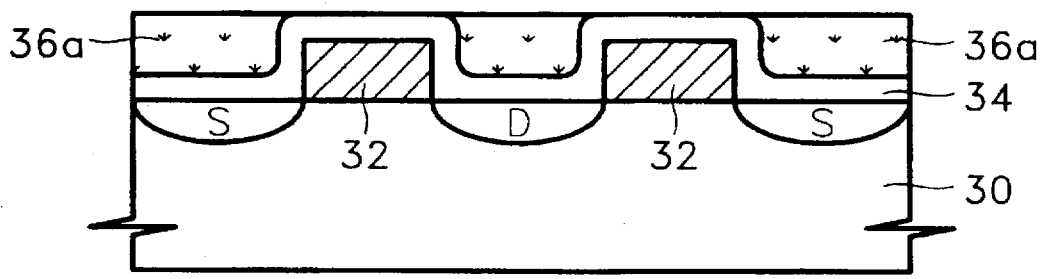

Referring now to FIG. 6, the conductive layer 36 is then etched. The etch end point is determined when the surface of the insulating layer 34 is exposed. Thus, when the etch process is completed, the conductive layer 36 is removed from the top of the gate electrode 32. As a result, the surface of the insulating layer 34 is exposed on the gate electrode 32, and a conductive layer pattern 36a, which is planar to the gate electrode 32, is formed. Accordingly, a surface of the insulating layer 34 on the gate is exposed.

Figure 7:
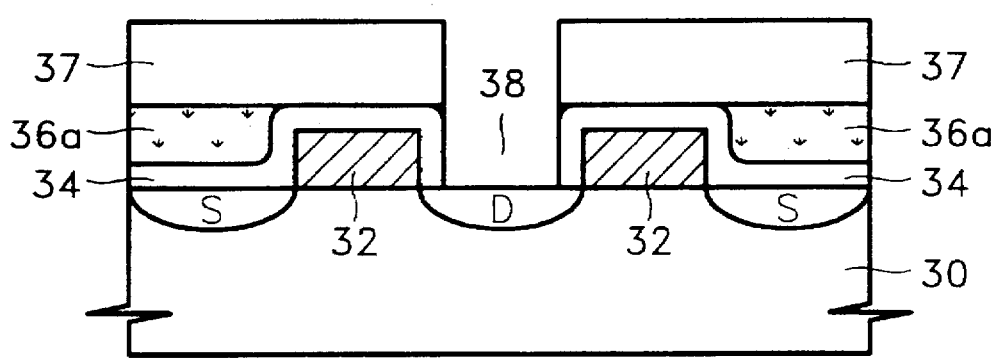

As shown in FIG. 7, a mask such as a photoresist is formed on the insulating layer 34 on the gate electrode 32 and the conductive layer pattern 36a and patterned. As a result, a photoresist pattern 37 is formed to expose the conductive layer 36a over the drain region D between the gate electrodes 32, and the photoresist pattern 37 is used as a mask to etch the conductive layer pattern 36a and insulating layer 34, to thereby form a contact hole in the insulating layer 34 and in the conductive layer pattern 36a and expose the source or drain regions (S/D). The exposed portion of the first conductive layer pattern 36a over the drain D is removed using the photoresist pattern 37 as an etch mask. The insulating layer 34 over the drain D is also removed, as shown in FIG. 7. As a result, a contact hole 38 which exposes the surface of the drain D is formed in the semiconductor substrate 30. The photoresist pattern 37 is then removed.

It may be desired to reduce the diameter of the contact hole 38 to form a more compact contact structure. In order to reduce the diameter of the contact hole 38, the border of the photoresist may be flowed slightly by heating the photoresist pattern 37 prior to etching through the first conductive layer pattern 36a and insulating layer 34. Alternatively, a spacer (not shown in FIG. 7) may be formed on the sidewalls of the photoresist pattern 37. It will also be understood that a polymer may be used instead of the photoresist pattern 37.

As also shown in FIG. 7, the contact hole 38 need not be very deep, because only one interlayer insulation layer is formed. Thus, the contact hole 38 has a low aspect ratio, i.e. a low ratio of depth versus diameter, to facilitate etching.

Figure 8:
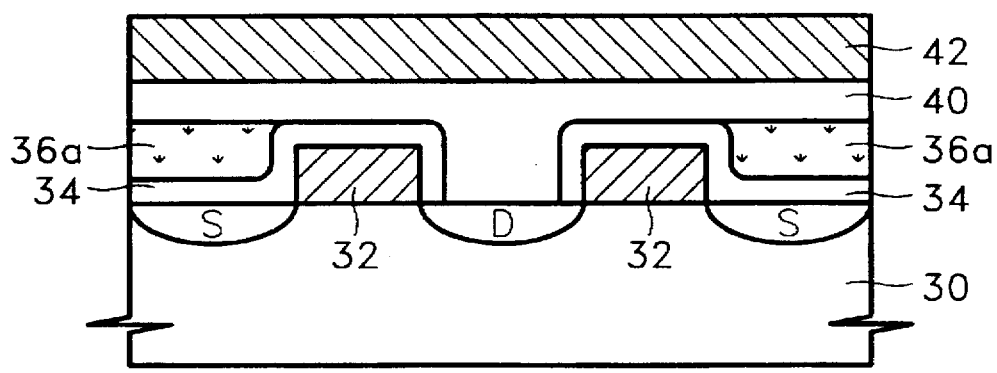
Figure 9:
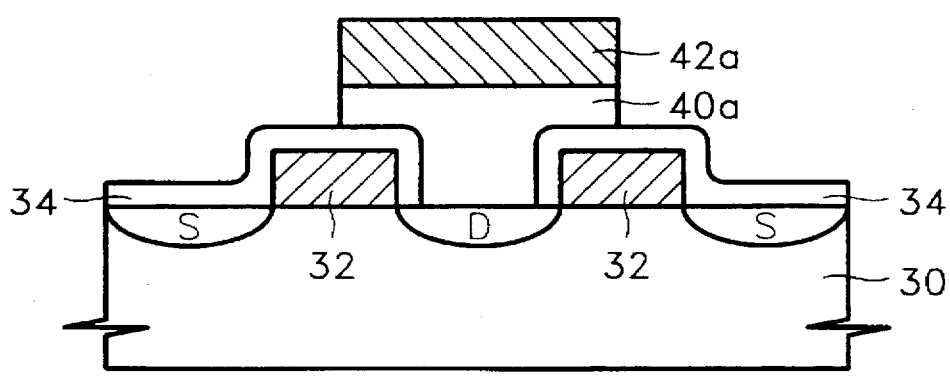

As shown in FIGS. 8 and 9, a conductive interconnect is formed in the contact hole 38 and on the gate electrode 32 and on the conductive layer pattern 36a. As shown in FIG. 8, a second conductive layer is blanket formed on the integrated circuit including in the contact hole 38. The second conductive layer 40 preferably fills the contact hole 38. Then, a third conductive layer 42 is formed on the second conductive layer 40. Preferably, the second conductive layer is a doped polysilicon layer which is similar to the first conductive layer 36. The third conductive layer 42 is preferably a tungsten silicide layer. These layers may be formed using techniques well known to those having skill in the art.

Referring now to FIG. 9, a photoresist layer (not shown) is then formed and patterned. The third and second conductive layers 42 and 40 and the first conductive layer pattern 36a are anisotropically etched using the photoresist as an etch mask. When the photoresist is removed, a conductive interconnect such as a bit line, including the patterned third conductive layer 42a and the patterned second conductive layer 40a, is formed.

Accordingly, the conductive interconnect including the patterned second and third conductive layers 40a and 42a is formed on the insulating layer 34 and on the drain region D. These layers may be patterned accurately because of the planarization of the underlying layer.

Figure 10:
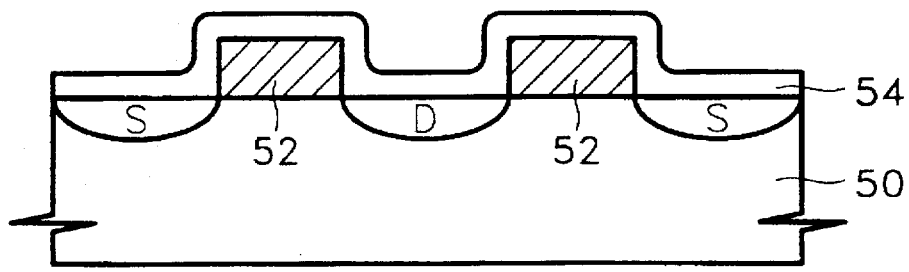
FIGS. 10–16 are cross-sectional views of a fabrication process according to a second embodiment of the present invention, during intermediate fabrication steps.
Figure 11:
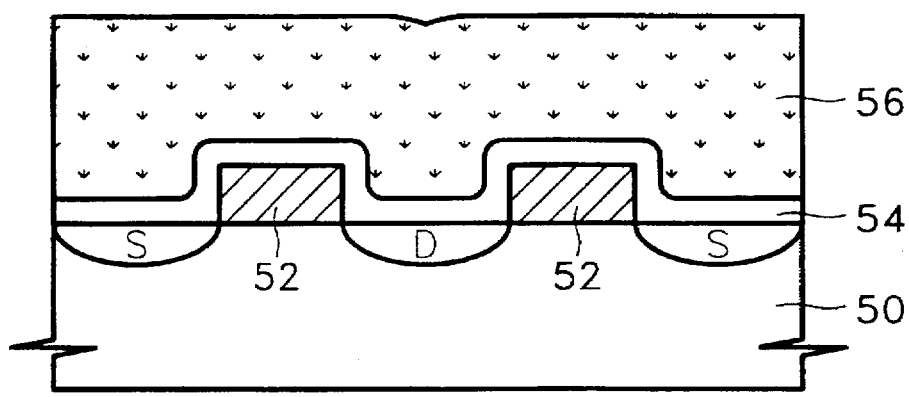

FIGS. 10–16 are cross-sectional views of a second embodiment of methods of forming conductive interconnects for integrated circuits according to the present invention. FIGS. 10 and 11 illustrate similar processes as was already described in connection with FIGS. 4 and 5. In particular, a gate electrode 52 is formed on a semiconductor substrate 50 and source S and drain D are formed. An insulating layer 54 and a conductive layer 56 are then formed.

Figure 12:
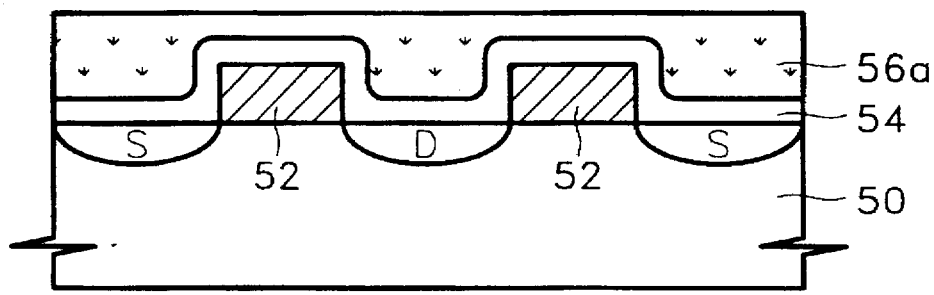

Referring now to FIG. 12, the conductive layer 56 is then etched to a predetermined thickness on the insulating layer 54, without exposing in the insulating layer 54. In other words, the conductive layer 56 on the gate top, opposite the substrate, is not eliminated. Accordingly, a first pattern 56a of conductive layer 56, with a predetermined thickness on the gate 52 is formed. This contrasts with FIG. 6, where the conductive layer 34 on the top of gate 32, opposite the substrate 30, is removed to expose the insulating layer 34 on the gate electrode 32.

Figure 13:
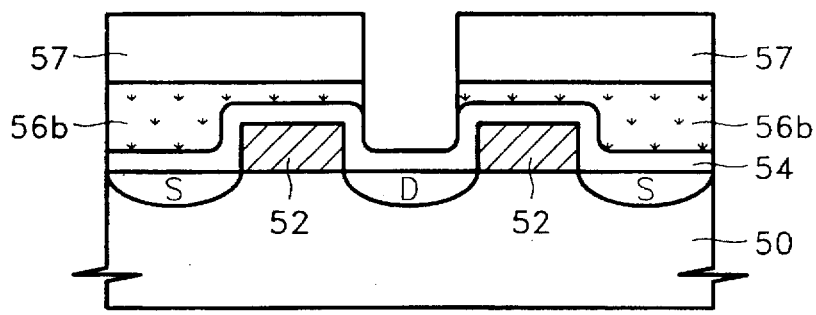

Referring now to FIG. 13, the first pattern 56a of the first conductive layer 56 on the drain region D is removed to form a patterned second pattern 56b of the first conductive layer 56. In particular, a patterned photoresist 57 is formed on the second pattern 56b of the first conductive layer 56. The exposed portion of the first pattern 56a of the first conductive layer 56 is then etched using the patterned photoresist 57 as a mask to expose the insulating layer 54 over the drain.

Figure 14:
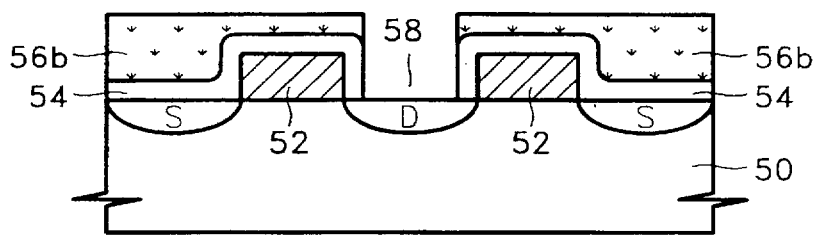

Then, referring to FIG. 14, a contact hole 58 is formed by removing the photoresist 57 and etching the exposed portion of the insulating layer 54, using the second pattern 56b of the first conductive layer 56 as a mask. The drain region D is thereby exposed. In this embodiment, the first pattern 56a of the first conductive layer 56 is removed over the drain region D using the patterned photoresist 57. In contrast with the first embodiment, the mask is then removed and the insulating layer 54 is removed over the drain region D using the patterned second pattern 56b of the first conductive layer 56 as an etch mask.

Figure 15:
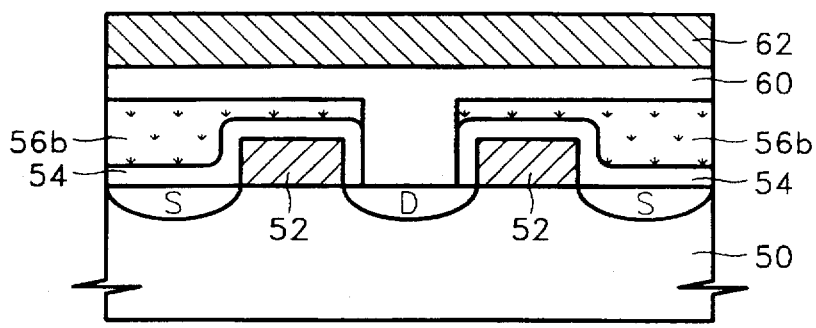
Figure 16:
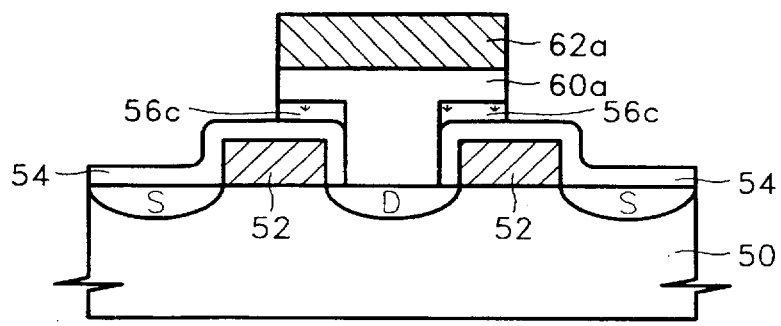

Then, as shown in FIGS. 15 and 16, a conductive interconnect is formed in the contact hole 58 (see FIG. 14) and on the second pattern 56b of the first conductive layer 56 on the gate 52. As shown in FIGS. 15 and 16, the conductive interconnect includes a second conductive layer 60 and a third conductive layer 62. As shown in FIG. 15, the second conductive layer 60 is formed on the integrated circuit and in the contact hole 58, preferably filling contact hole 58. The third conductive layer 62 is then formed on the second conductive layer 60. The second and third conductive layers 60 and 62 are preferably formed of doped polysilicon and tungsten silicide, as was described in the first embodiment.

A patterned photoresist (not shown) is then formed on the third conductive layer 62. The third conductive layer 62, the second conductive layer 60 and the second pattern 56b of the first conductive layer 56 are then anisotropically etched using the patterned photoresist as a mask to form a conductive interconnect such as a bit line. The conductive interconnect of FIG. 16 includes the third pattern 56c of the first conductive layer 56 on the gate 52, the second conductive layer pattern 60a in the contact hole 58 (see FIG. 14) and on the third pattern 56c of the first conductive layer 56, and a third conductive layer pattern 62a on the second conductive layer pattern 60a.

In summary, in conductive interconnect forming methods of the present invention, a conductive layer, preferably doped polysilicon, is used as a planarization layer. A photolithography process is performed after forming a tungsten silicide layer, so that patterning of the bit line may be performed. Moreover, since heat need not be applied during the planarization process, the transistor characteristics need not be degraded. Finally, since a single layer interlayer oxide may be provided, good aspect ratios may be produced for forming the contact.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A method of forming a conductive interconnect for an integrated circuit field effect transistor including spaced apart source and drain regions in an integrated circuit substrate and a gate on the integrated circuit substrate between the spaced apart source and drain regions, comprising the steps of:

forming a continuous insulating layer which extends continuously on the spaced apart source and drain regions and on the gate therebetween;

forming a continuous conductive layer on the continuous insulating layer;

planarizing the continuous conductive layer to form a planarized conductive layer;

forming a contact hole in the continuous insulating layer and in the planarized conductive layer to thereby expose the source or drain region; and forming a conductive interconnect in the contact hole and on the gate.

2. A method according to claim 1 wherein said planarizing step further comprises a step of etching the continuous conductive layer to remove the continuous conductive layer from the gate.

3. A method according to claim 1 whereto said planarizing step further comprises a step of etching the continuous conductive layer to expose the continuous insulating layer on the gate.

4. A method according to claim 1 wherein said planarizing step further comprises a step of etching the continuous conductive layer without eliminating the continuous conductive layer on the gate.

5. A method according to claim 1 wherein said planarizing step further comprises a step of etching the continuous conductive layer without exposing the insulating layer on the gate.

6. A method according to claim 1 whereto said step of forming a contact hole further comprises steps of:

patterning a mask on the planarized conductive layer; and etching the planarized conductive layer and the continuous insulating layer using the patterned mask, to thereby expose the source or drain region.

7. A method according to claim 1 wherein said step of forming a contact hole further comprises steps of:

patterning a mask on the planarized conductive layer;

etching the planarized conductive layer using the patterned mask; removing the patterned mask; and etching the continuous insulating layer using the etched conductive layer, to thereby expose the source or drain region.

8. A method according to claim 6 wherein the following step is performed between the steps of patterning and etching:

heating the patterned mask to thereby cause the patterned mask to flow and reduce the exposed areas thereof.

9. A method according to claim 6 wherein the following step is performed between the steps of patterning and etching:

forming a sidewall spacer in the patterned mask to thereby decrease the exposed area thereof.

10. A method according to claim 1 wherein said step of forming a continuous conductive layer further comprises a step of:

forming a continuous doped polysilicon layer on the continuous insulating layer.

11. A method according to claim 3 wherein the step of forming a conductive interconnect further comprises steps of:

forming a doped polysilicon layer in the contact hole and on the insulating layer on the gate;

forming a tungsten silicide layer on the doped polysilicon layer; and patterning the doped polysilicon layer and the tungsten silicide layer.

12. A method according to claim 4 wherein the step of forming a conductive interconnect further comprises steps of:

forming a doped polysilicon layer in the contact hole and on the insulating layer on the gate;

forming a tungsten silicide layer on the doped polysilicon layer; and patterning the doped polysilicon layer and the tungsten silicide layer.

13. A method according to claim 4 wherein the step of forming a conductive interconnect further comprises steps of:

forming a doped polysilicon layer in the contact hole and on the conductive layer on the gate;

forming a tungsten silicide layer on the doped polysilicon layer; and patterning the doped polysilicon layer and the tungsten silicide layer.

14. A method according to claim 5 wherein the step of forming a conductive interconnect further comprises steps of:

forming a doped polysilicon layer in the contact hole and on the conductive layer on the gate;

forming a tungsten silicide layer on the doped polysilicon layer; and patterning the doped polysilicon layer and the tungsten silicide layer.

15. A method according to claim 1 wherein said field effect transistor is an integrated circuit memory cell field effect transistor, and wherein the step of forming a conductive interconnect layer comprises the step of:

forming a conductive bit line in the contact hole and on the gate.

16. A method of forming a conductive interconnect for an integrated circuit field effect transistor including spaced apart source and drain regions in an integrated circuit substrate and a gate on the integrated circuit substrate between the spaced apart source and drain regions, comprising the steps of:

forming a continuous insulating layer which extends continuously on the spaced apart source and drain regions and on the gate therebetween;

forming a continuous doped polysilicon layer on the continuous insulating layer;

planarizing the continuous doped polysilicon layer to form a planarized doped polysilicon layer;

forming a contact hole in the continuous insulating layer and in the planarized doped polysilicon layer to thereby expose the source or drain region; and forming a conductive interconnect in the contact hole and on the gate.

17. A method according to claim 16 wherein said planarizing step further comprises a step of etching the continuous doped polysilicon layer to remove the doped polysilicon layer from the gate.

18. A method according to claim 16 wherein said planarizing step further comprises a step of etching the continuous doped polysilicon layer to expose the insulating layer on the gate.

19. A method according to claim 16 wherein said planarizing step further comprises a step of etching the continuous doped polysilicon layer without eliminating the doped polysilicon layer on the gate.

20. A method according to claim 16 wherein said planarizing step further comprises a step of etching the continuous doped polysilicon layer without exposing the insulating layer on the gate.

* * * * *